United States Patent
Guo et al.

(10) Patent No.: US 9,190,968 B2
(45) Date of Patent: Nov. 17, 2015

(54) VOLTAGE DRIVING APPARATUS FOR POWER AMPLIFIER, POWER AMPLIFYING SYSTEM, POWER SUPPLY DEVICE AND COMMUNICATION DEVICE

(71) Applicant: HUAWEI DEVICE CO., LTD., Shenzhen (CN)

(72) Inventors: Zufeng Guo, Shenzhen (CN); Ping Li, Chengdu (CN); Conglong Xie, Shenzhen (CN); Gang Zhang, Shenzhen (CN)

(73) Assignee: HUAWEI DEVICE CO., LTD., Shenzhen (CN)

( * ) Notice: Subject to any disclaimer, the term of this patent is extended or adjusted under 35 U.S.C. 154(b) by 26 days.

(21) Appl. No.: 13/647,013

(22) Filed: Oct. 8, 2012

(65) Prior Publication Data

US 2013/0029617 A1    Jan. 31, 2013

Related U.S. Application Data

(63) Continuation of application No. PCT/CN2011/072336, filed on Mar. 31, 2011.

(30) Foreign Application Priority Data

Apr. 9, 2010   (CN) .................. 2010 2 0156021 U
Apr. 30, 2010  (CN) .................. 2010 2 0178456 U (51) Int. Cl.
| | |
|---|---|
| H01Q 11/12 | (2006.01) |
| H04B 1/04 | (2006.01) |
| H03F 3/24 | (2006.01) |
| H03F 1/02 | (2006.01) |
| H03F 1/30 | (2006.01) |
| H03F 3/189 | (2006.01) |

(52) U.S. Cl.
CPC .................. *H03F 3/24* (2013.01); *H03F 1/025* (2013.01); *H03F 1/0222* (2013.01);
(Continued)

(58) Field of Classification Search
CPC ............ H03G 3/3042; H03F 3/24; H03F 1/30
USPC .......................................... 455/127.1, 127.4
See application file for complete search history.

(56) References Cited

U.S. PATENT DOCUMENTS 6,624,702 B1    9/2003  Dening
6,639,471 B2 *  10/2003  Matsuura et al. ............. 330/302
(Continued)

FOREIGN PATENT DOCUMENTS

CN    1756099    4/2006
CN    1765063    4/2006
(Continued)

OTHER PUBLICATIONS

Written Opinion of the International Searching Authority mailed Jun. 23, 2011 in corresponding International Patent Application No. PCT/CN2011/072336.
(Continued)

*Primary Examiner* — Simon Nguyen
(74) *Attorney, Agent, or Firm* — Staas & Halsey LLP (57) ABSTRACT

A voltage driving apparatus (1) for a power amplifier, a power amplifying system, a power supply device and a communication device are disclosed. The voltage driving apparatus (1) for the power amplifier includes a voltage input module (11), a voltage output module (12), a signal input module (13), and a control module (14). The voltage output module (12) is connected to the power amplifier to provide a voltage. The signal input module (13) is configured to receive a variable input electric signal. The control module (14) is electrically connected to the voltage input module (11), the voltage output module (12), and the signal input module (13) and configured to dynamically adjust the output voltage of the voltage output module (12) according to the variable input electric signal received by the signal input module (13).

14 Claims, 4 Drawing Sheets

(52) U.S. Cl.
CPC ............... *H03F 1/0255* (2013.01); *H03F 1/30* (2013.01); *H03F 1/304* (2013.01); *H03F 3/189* (2013.01); *H03F 2200/105* (2013.01); *H03F 2200/451* (2013.01); *H03F 2200/462* (2013.01); *H03F 2200/465* (2013.01); *H03F 2200/468* (2013.01)

(56) References Cited

U.S. PATENT DOCUMENTS

| | | | |
|---|---|---|---|
| 6,900,697 B1* | 5/2005 | Doyle et al. | 330/297 |
| 7,062,236 B2* | 6/2006 | Midtgaard et al. | 455/126 |
| 7,315,211 B1* | 1/2008 | Lee et al. | 330/285 |
| 7,539,466 B2* | 5/2009 | Tan et al. | 455/127.1 |
| 7,551,688 B2* | 6/2009 | Matero et al. | 375/297 |
| 7,684,514 B2* | 3/2010 | Saito et al. | 375/297 |
| 8,219,045 B2* | 7/2012 | Stralko | 455/115.1 |
| 8,432,224 B1* | 4/2013 | Woo et al. | 330/285 |
| 8,655,293 B2* | 2/2014 | Langer et al. | 455/127.2 |
| 2002/0171481 A1 | 11/2002 | Sasho et al. | |
| 2004/0198271 A1* | 10/2004 | Kang | 455/127.1 |
| 2006/0246857 A1 | 11/2006 | Grillo et al. | |
| 2007/0146076 A1 | 6/2007 | Baba | |
| 2007/0249304 A1* | 10/2007 | Snelgrove et al. | 455/127.2 |
| 2007/0281635 A1* | 12/2007 | McCallister et al. | 455/126 |
| 2008/0009248 A1* | 1/2008 | Rozenblit et al. | 455/127.1 |
| 2008/0032643 A1 | 2/2008 | Liu et al. | |
| 2008/0280575 A1* | 11/2008 | Pesola | 455/127.1 |
| 2010/0291975 A1* | 11/2010 | Dimpflmaier et al. | 455/572 |

FOREIGN PATENT DOCUMENTS

| | | |
|---|---|---|
| CN | 1938942 | 3/2007 |
| CN | 201063800 | 5/2008 |
| CN | 101405934 | 4/2009 |
| CN | 101507108 | 8/2009 |
| CN | 201623691 | 11/2010 |
| CN | 201733279 | 2/2011 |
| JP | 2008-193298 | 8/2008 |
| WO | 99/60698 | 11/1999 |

OTHER PUBLICATIONS

International Search Report of PCT/CN2011/072336 mailed Jun. 23, 2011.

Extended European Search Report issued Jan. 24, 2013, in corresponding European Patent Application No. 11765034.1.

* cited by examiner

VOLTAGE DRIVING APPARATUS FOR POWER AMPLIFIER, POWER AMPLIFYING SYSTEM, POWER SUPPLY DEVICE AND COMMUNICATION DEVICE

CROSS-REFERENCE TO RELATED APPLICATION

This application is a continuation of International Application No. PCT/CN2011/072336, filed on Mar. 31, 2011, which claims priority to Chinese Patent Application No. 201020156021.X, filed on Apr. 9, 2010, and Chinese Patent Application No. 201020178456.4, filed on Apr. 30, 2010, all of which are hereby incorporated by reference in their entireties.

FIELD OF THE INVENTION

The present invention relates to the field of communication technologies, and in particular, to a voltage driving apparatus for a power amplifier (Power Amplifier, abbreviated as PA), a power amplifying system, a power supply device, and a communication device.

BACKGROUND OF THE INVENTION

A radio frequency power amplifier is an important component of a transmitting device. Its main technical indicators include output power and efficiency. Based on the prior art and the core principle of the radio frequency power amplifier, the efficiency of the radio frequency power amplifier is low. The radio frequency power amplifier in the prior art usually adopts a multi-stage gain mode. A bias voltage Vcc1 supplies power to the internal logical circuit and bias circuit. A bias voltage Vcc2 supplies power to the internal radio frequency power amplifier. A communication device normally does not need to transmit signals at the maximum power. In order to increase the efficiency on occasions except when the radio frequency power amplifier uses the maximum power to transmit signals, the bias voltage generally adopts a fixed voltage supply and adopts different gain modes according to different power output requirements, for example, a Vmode0 gain mode and a Vmode1 gain mode.

During the implementation of the present invention, the inventor discovers that the prior art has at least the following problem: If the communication device uses the non-maximum power to transmit signals, the power loss of the radio frequency power amplifier is large and the efficiency is low.

SUMMARY OF THE INVENTION

Embodiments of the present invention provide a voltage driving apparatus for a power amplifier, a power amplifying system, a power supply device, and a communication device, to reduce the power loss of the power amplifier and increase the efficiency of the power amplifier.

An embodiment of the present invention provides a voltage driving apparatus for a power amplifier, including a voltage input module and a voltage output module, where the voltage output module is connected to the power amplifier to provide a supply voltage; and the voltage driving apparatus further includes: a signal input module, configured to receive a variable input electric signal; a control module, electrically connected to the signal input module, the voltage input module, and the voltage output module, and configured to dynamically adjust the output voltage of the voltage output module according to the variable input electric signal received by the signal input module.

An embodiment of the present invention provides a power amplifying system, including a power amplifier and a voltage driving apparatus, where the voltage driving apparatus includes a voltage input module and a voltage output module, where the voltage output module is connected to the power amplifier to provide a supply voltage; and the voltage driving apparatus further includes: a signal input module, configured to receive a variable input electric signal; a control module, electrically connected to the signal input module, the voltage input module, and the voltage output module, and configured to dynamically adjust the output voltage of the voltage output module according to the variable input electric signal received by the signal input module.

An embodiment of the present invention provides a power supply device for a radio frequency power amplifier, where the power supply device is communicatively connected to the radio frequency power amplifier, and includes: a parameter detection module, disposed on a radio frequency transmit channel of the radio frequency power amplifier and configured to detect a system parameter on the radio frequency transmit channel; a control module, connected to the parameter detection module and configured to determine a voltage parameter according to the system parameter detected by the parameter detection module; and a power supply module, connected to the control module and configured to provide a voltage corresponding to the voltage parameter determined by the control module to the radio frequency power amplifier.

An embodiment of the present invention provides a communication device, including a radio frequency power amplifier and a power supply device, where the radio frequency power amplifier is communicatively connected to the power supply device and the power supply device includes: a parameter detection module, disposed on a radio frequency transmit channel of the radio frequency power amplifier and configured to detect a system parameter on the radio frequency transmit channel; a control module, connected to the parameter detection module and configured to determine a voltage parameter according to the system parameter detected by the parameter detection module; and a power supply module, connected to the control module and configured to provide a voltage corresponding to the voltage parameter determined by the control module to the radio frequency power amplifier.

In the embodiments of the present invention, the control module is used to adjust the voltage of the power amplifier, to reduce the power loss of the power amplifier and increase the efficiency of the power amplifier. This reduces the size and energy consumption of a communication device, to save the cost of use, prolong the service life of parts, and make a communication system less dependent on an environment.

BRIEF DESCRIPTION OF THE DRAWINGS

To describe the technical solutions in the embodiments of the present invention more clearly, accompanying drawings required for describing the embodiments are briefly introduced below. Apparently, the accompanying drawings in the following description are merely about some embodiments of the present invention, and persons of ordinary skill in the art may further obtain other drawings according to the accompanying drawings without any creative effort.

DETAILED DESCRIPTION OF THE EMBODIMENTS

It should be noted that, the described embodiments are only a part of the embodiments of the present invention rather than all the embodiments. All other embodiments obtained by persons of ordinary skill in the art based on the embodiments of the present invention without creative effects shall fall within the protection scope of the present invention.

Embodiment 1

Figure 1:
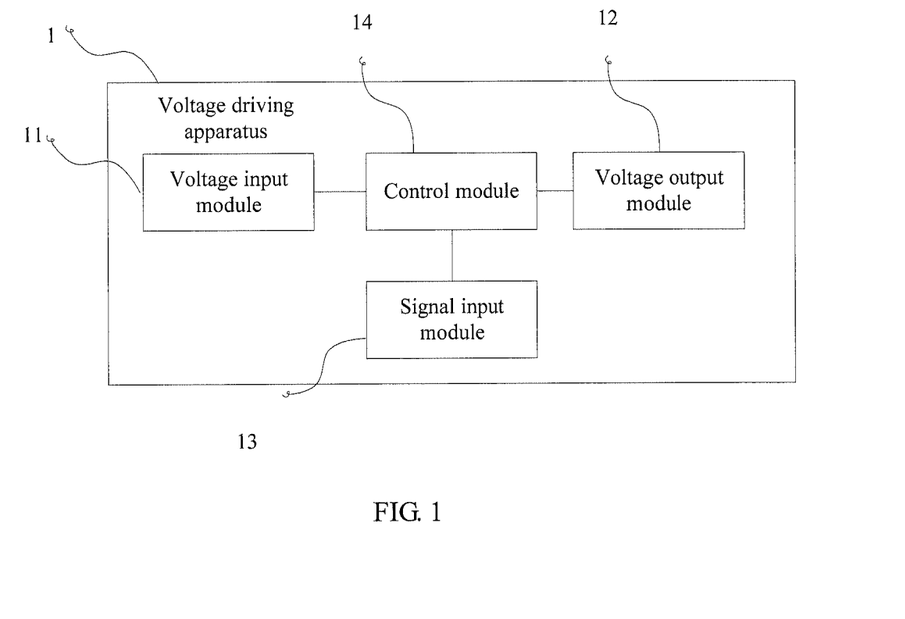
FIG. 1 is a schematic structural diagram according to first and second embodiments of the present invention.

A first embodiment of the present invention provides a voltage driving apparatus 1 for a power amplifier. A structure of the apparatus is shown in FIG. 1, including a voltage input module 11 and a voltage output module 12. The voltage input module 11 is electrically connected to a supply voltage to provide an input voltage to the voltage driving apparatus. The voltage output module 12 is electrically connected to a power amplifier (not shown in the figure, referring to FIG. 3) to provide an input voltage to the power amplifier. The voltage driving apparatus 1 further includes:

a signal input module 13, configured to receive an input electric signal which is a variable input electric signal; and a control module 14, electrically connected to the signal input module 13, the voltage input module 11, and the voltage output module 12, and configured to dynamically adjust the output voltage of the voltage output module 12 according to the variable input electric signal received by the signal input module 13.

According to the voltage driving apparatus for the power amplifier provided in the embodiment of the present invention, a signal input module is added in the voltage driving apparatus for the power amplifier provided in the embodiment of the present invention, so that the output voltage is adjusted dynamically according to the variable input electric signal received by the signal input module. Compared with the fixed output voltage in the prior art, with the present invention, a terminal can be more energy-saving through dynamic adjustment of the output voltage and the heat generated by the terminal can be reduced. The voltage driving apparatus for the power amplifier may be used on a terminal, such as a data card, an external 3G antenna, a mobile terminal, or a PDA.

Embodiment 2

A second embodiment of the present invention provides a voltage driving apparatus 1 for a power amplifier. A structure of the apparatus is shown in FIG. 1, including a voltage input module 11 and a voltage output module 12. The voltage input module 11 is electrically connected to a power supply system (not shown in the figure) to provide an input voltage to the voltage driving apparatus 1. The voltage output module 12 is electrically connected to the power amplifier (not shown in the figure, referring to FIG. 3) to provide an input voltage to the power amplifier. The voltage driving apparatus 1 further includes:

a signal input module 13, configured to receive an input electric signal which is a variable input electric signal; and a control module 14, electrically connected to the signal input module 13, the voltage input module 11, and the voltage output module 12, and configured to dynamically adjust the output voltage of the voltage output module 12 according to the variable input electric signal received by the signal input module 13.

Figure 2:
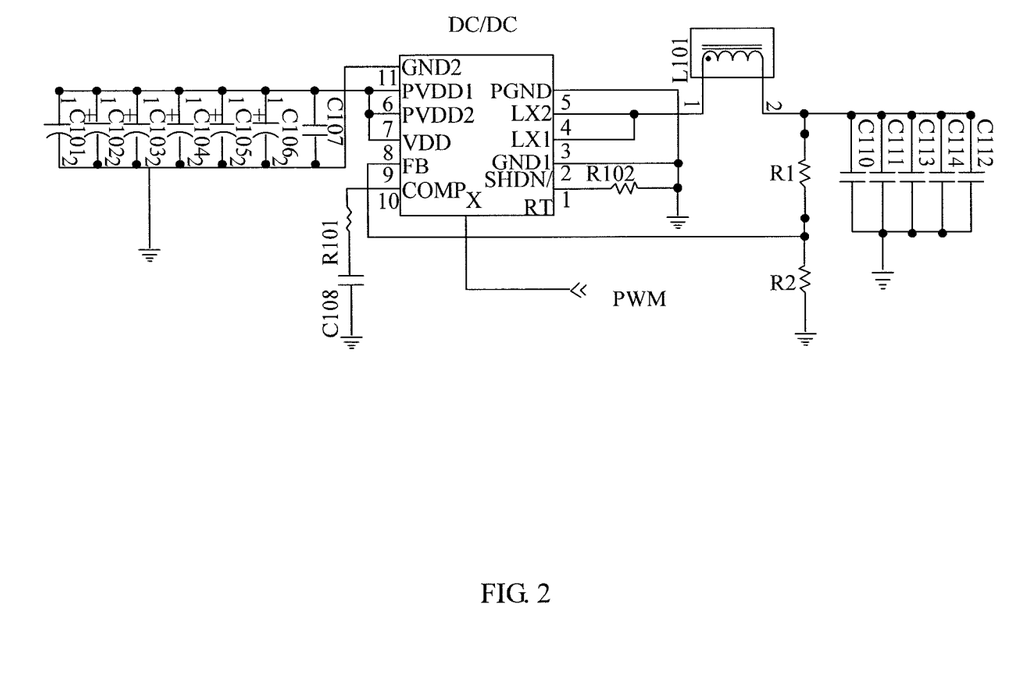
FIG. 2 a schematic circuit diagram where a DC/DC chip is used as a voltage driving apparatus according to the present invention.

The voltage driving apparatus 1 may be a DC/DC chip. A specific circuit diagram is shown in FIG. 2. The PVDD1, PVDD2, and VDD pins of the DC/DC chip act as the voltage input module 11; the LX1 and LX2 pins of the DC/DC chip act as the voltage output module 12. An X pin acts as the signal input module 13 to receive a variable input electric signal. The input electric signal may be a bias voltage or a pulse signal. When the input signal is a bias voltage, the signal input module 13 may be a bias voltage receiving module to receive an input bias voltage; the DC/DC chip determines the output voltage of the voltage output module 12 according to the voltage value of the bias voltage. When the input electric signal is a pulse signal, the signal input module 13 may be a pulse duty cycle modulating and receiving module to receive an input pulse signal; the DC/DC chip determines the output voltage of the voltage output module 12 according to the duty cycle of the pulse signal. The control module 14 may be an internal circuit (not shown in the figure) of the DC/DC chip. The internal circuit needs to detect the input electric signal. There are multiple means in the prior art to achieve this purpose, for example, by adopting a comparison circuit or a detection circuit, and the embodiment of the present invention is not limited thereto. The internal circuit is capable of identifying the bias voltage or the input pulse signal and dynamically adjusting the output voltage value of LX1 and LX2 according to the identified change of the voltage or the duty cycle of the input pulse signal, to implement real-time dynamic adjustment of the supply voltage of the PA.

The dynamic adjustment may be implemented according to the input voltage or the pulse signal, which is specifically:

After the bias voltage VBIAS is input into the DC/DC chip, the output voltage is determined according to Table 1 of the internal circuit. In this way, numerous voltage values may be obtained theoretically, which means that the smooth switching of the supply voltage of the PA can be achieved.

TABLE 1

| VBIAS = V1 | VBIAS = V2 | VBIAS = V3 | ... | VBIAS = Vx |
|---|---|---|---|---|
| V1x | V2x | V3x | | Vxx |

Alternatively, after the pulse signal PWM is input into the DC/DC chip, the output voltage is determined according to Table 2 of the internal circuit. In this way, numerous voltage values may be obtained theoretically, which means that the smooth switching of the supply voltage of the PA can be achieved.

TABLE 2

| Duty = 1% | Duty = 2% | Duty = 3% | ... | Duty = x% |
|---|---|---|---|---|
| V1 | V2 | V3 | | Vx |

A terminal or an external device may generate the input electric signal dynamically according to the working voltage required by the power amplifier and send the input electric signal to the voltage driving apparatus. The correspondence between the output voltage and the input electric signal may be obtained through inverse induction according to the foregoing Table 1 and Table 2. After the input electric signal is input to the DC/DC chip, the internal circuit of the DC/DC chip obtains the corresponding output voltage according to Table 1 and Table 2, so as to adjust the supply voltage of the PA dynamically according to the variable input electric signal. As compared with the fixed output voltage in the prior art, the energy consumption of a power amplifying system can be reduced and the amount of generated heat can be reduced.

The implementation through a DC/DC chip is only one of implementation manners of the present invention. The apparatus may also be implemented by adopting a new independent voltage driving apparatus or may be implemented through another chip, which is not limited by the present invention. The bias voltage and pulse signal each are only one implementation manner of the input electric signal of the embodiment of the present invention, which is not limited by the embodiment of the present invention.

In the embodiment of the present invention, an existing DC/DC chip is improved by inputting a variable input electric signal at one X pin of the DC/DC chip without the need of changing the circuit structure of the voltage driving apparatus made up of the existing DC/DC chip. In this way, the DC/DC chip can control the input voltage according to the external input electric signal to save electrical power. An existing terminal such as a data card or a 3G antenna, is inserted into a portable computer for use, and an existing terminal, such as a mobile terminal or a PDA is already intelligent. Therefore, an input electric signal can be sent from the outside to the voltage driving apparatus of the terminal according to the voltage value required by the power amplifier of the current terminal to dynamically control the output voltage of the voltage driving apparatus.

The voltage driving apparatus for the power amplifier provided in the embodiment of the present invention, a signal input module is added in the voltage driving apparatus for the power amplifier provided in the embodiment of the present invention, so that the output voltage is adjusted dynamically according to the variable input electric signal received by the signal input module. Compared with the fixed output voltage in the prior art, with the present invention, the terminal can be more energy-saving through dynamic adjustment of the output voltage, and the heat generated by the terminal can be reduced. The voltage driving apparatus for the power amplifier may be used on a terminal, such as a data card, an external 3G antenna, a mobile terminal, or a PDA.

Embodiment 3

Figure 3:
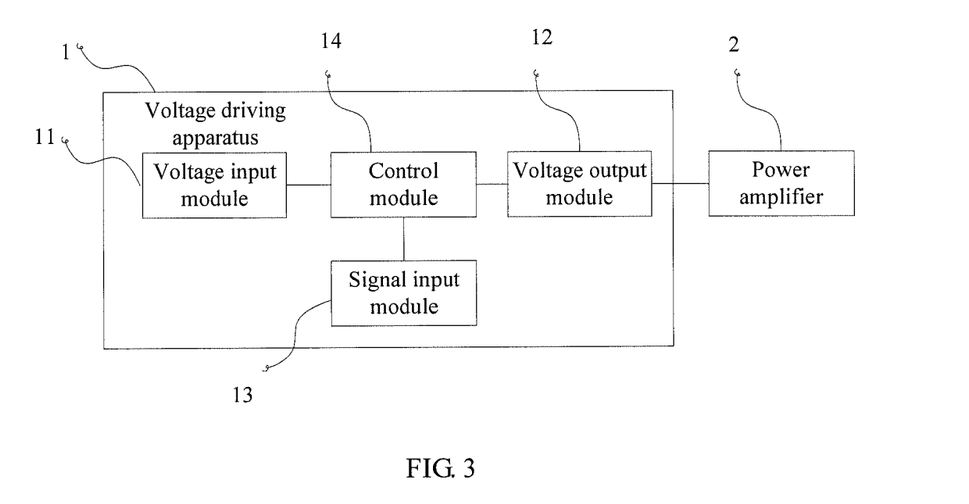
FIG. 3 is a schematic structural diagram according to third and fourth embodiments of the present invention.

A third embodiment of the present invention provides a power amplifying system. A structure of the system is shown in FIG. 3, including a power amplifier 2 and a voltage driving apparatus 1. The voltage driving apparatus 1 includes a voltage input module 11 and a voltage output module 12. The voltage input module 11 is electrically connected to a power supply system (not shown in the figure) and configured to provide an input voltage to the voltage driving apparatus 1. The voltage output module 12 is electrically connected to the power amplifier 2 and configured to provide an input voltage to the power amplifier 2. The voltage driving apparatus 1 further includes:

a signal input module 13, configured to receive an input electric signal which is a variable input electric signal; and a control module 14, electrically connected to the signal input module 13, the voltage input module 11, and the voltage output module 12, and configured to dynamically adjust the output voltage of the voltage output module 12 according to the variable input electric signal received by the signal input module 13.

According to the power amplifying system provided in the embodiment of the present invention, the output voltage is determined through dynamic adjustment of the received input electric signal. Compared with the fixed output voltage in the prior art, with the present invention, a terminal can be more energy-saving through dynamic adjustment of the output voltage and the heat generated by the terminal can be reduced. The power amplifying system may be used on a terminal, such as a data card, an external 3G antenna, a mobile terminal, or a PDA.

Embodiment 4

A fourth embodiment of the present invention provides a power amplifying system. A structure of the system is shown in FIG. 3, including a power amplifier 2 and a voltage driving apparatus 1. The voltage driving apparatus 1 includes a voltage input module 11 and a voltage output module 12. The voltage input module 11 is electrically connected to a power supply system (not shown in the figure) and configured to provide an input voltage to the voltage driving apparatus 1. The voltage output module 12 is electrically connected to the power amplifier (not shown in the figure) and configured to provide an input voltage to the power amplifier. The voltage driving apparatus 1 further includes:

a signal input module 13, configured to receive an input electric signal which is a variable input electric signal; and a control module 14, electrically connected to the signal input module 13, the voltage input module 11, and the voltage output module 12, and configured to dynamically adjust the output voltage of the voltage output module 12 according to the variable input electric signal received by the signal input module 13.

The voltage driving apparatus 1 may be a DC/DC chip. A specific circuit diagram is shown in FIG. 2. The PVDD1, PVDD2, and VDD pins of the DC/DC chip act as the voltage input module 11; the LX1 and LX2 pins of the DC/DC chip act as the voltage output module 12. An X pin acts as the signal input module 13 to receive a variable input electric signal. The input electric signal may be a bias voltage or pulse signal. When the input signal is a bias voltage, the signal input module 13 may be a bias voltage receiving module to receive an input bias voltage; the DC/DC chip determines the output voltage of the voltage output module 12 according to the voltage value of the bias voltage. When the input electric signal is a pulse signal, the signal input module 13 may be a pulse duty cycle modulating and receiving module to receive an input pulse signal; the DC/DC chip determines the output voltage of the voltage output module according to the duty cycle of the pulse signal. The control module 14 may be an internal circuit of the DC/DC chip. The internal circuit needs to detect the input electric signal. There are multiple means in the prior art to achieve this purpose, for example, by adopting a comparison circuit or a detection circuit, and the embodiment of the present invention is not limited thereto. The internal circuit is capable of identifying the bias voltage or the input pulse signal and dynamically adjusting the output voltage value of LX1 and LX2 according to the identified change of the voltage or the duty cycle of the input pulse signal, to implement real-time dynamic adjustment of the supply voltage of the PA.

A terminal or an external device may generate the input electric signal dynamically according to the working voltage required by the power amplifier and send the input electric signal to the voltage driving apparatus. The correspondence between the output voltage and the input electric signal may be obtained through inverse induction according to the foregoing Table 1 and Table 2. After the input electric signal is input to the DC/DC chip, the internal circuit of the DC/DC chip obtains the corresponding output voltage according to Table 1 and Table 2, so as to adjust the supply voltage of the PA dynamically according to the variable input electric signal. As compared with the fixed output voltage in the prior art, the energy consumption of a power amplifying system can be reduced and the amount of generated heat can be reduced.

The implementation through a DC/DC chip is only one of implementation manners of the present invention. The apparatus may also be implemented by adopting a new independent voltage driving apparatus or may be implemented through another chip, which is not limited by the present invention. The bias voltage and pulse signal each are only one implementation manner of the input electric signal of the embodiment of the present invention, which is not limited by the embodiment of the present invention.

In the embodiment of the present invention, an existing DC/DC chip is improved by inputting a variable input electric signal at one X pin of the DC/DC chip without the need of changing the circuit structure of the voltage driving apparatus made up of the existing DC/DC chip. In this way, the DC/DC chip can control the input voltage according to the external input electric signal to save electrical power. An existing terminal, such as a data card or a 3G antenna, is inserted into a portable computer for use; and an existing terminal, such as a mobile terminal or a PDA is already intelligent. Therefore, an input electric signal can be sent from the outside to the voltage driving apparatus of the terminal according to the voltage value required by the power amplifier of the current terminal to dynamically control the output voltage of the voltage driving apparatus.

According to the embodiment, in the power amplifying system provided in the embodiment of the present invention, a signal input module is added in the voltage driving apparatus for the power amplifier provided in the embodiment of the present invention, so that the output voltage is adjusted dynamically according to the variable input electric signal received by the signal input module. Compared with the fixed output voltage in the prior art, with the present invention, a terminal can be more energy-saving through dynamic adjustment of the output voltage, and the heat generated by the terminal can be reduced. The power amplifying system may be used on a terminal, such as a data card, an external 3G antenna, a mobile terminal, or a PDA. According to the present invention, the means of implementation through an existing DC/DC chip is also provided, and the existing DC/DC chip is improved to receive the input electric signal and determine the output voltage dynamically according to the input electric signal. An existing terminal, such as a data card or a 3G antenna, is inserted into a portable computer for use; and an existing terminal, such as a mobile terminal or a PDA, is already intelligent. Therefore, an input electric signal can be sent from the outside to the voltage driving apparatus of the terminal according to the voltage value required by the power amplifier of the current terminal, so as to dynamically control the output voltage of the voltage driving apparatus.

Embodiment 5

Figure 4:
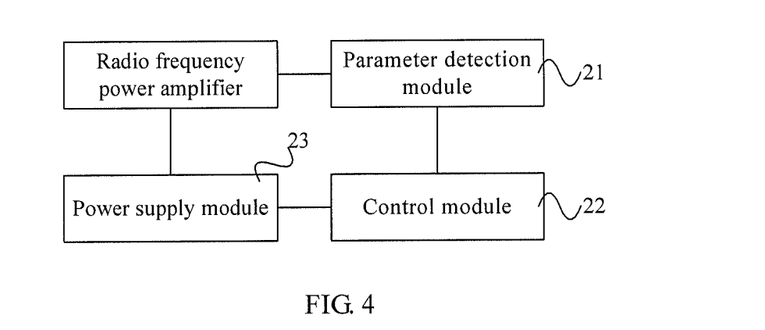
FIG. 4 is a schematic structural diagram of a power supply device for a radio frequency power amplifier according to a fifth embodiment of the present invention.

FIG. 4 is a schematic structural diagram of a power supply device for a radio frequency power amplifier provided in a fifth embodiment of the present invention. As shown in FIG. 4, the power supply device for the radio frequency power amplifier in the embodiment includes a parameter detection module 21, a control module 22, and a power supply module 23. The parameter detection module 21 is disposed on a radio frequency transmit channel of the radio frequency power amplifier and configured to detect a system parameter, such as power, a current, on the radio frequency transmit channel; the control module 22 is connected to the parameter detection module 21 and configured to determine a voltage parameter according to the system parameter detected by the parameter detection module 21; the power supply module 23 is connected to the control module 22 and configured to provide a voltage corresponding to the voltage parameter determined by the control module 22 to the radio frequency power amplifier.

In the embodiment, the parameter detection module 21 may be disposed in any position on the radio frequency transmit channel. Specifically, the parameter detection module 21 may be disposed at the output end (PA Output) of the radio frequency power amplifier to detect the output system parameter of the radio frequency power amplifier; or may be disposed at the input end (PA Input) of the radio frequency power amplifier to detect the input system parameter of the radio frequency power amplifier. For example:

If the parameter detection module 21 is disposed at the output end of the radio frequency power amplifier, the parameter detection module 21 may detect the transmit power of the radio frequency power amplifier. The control module 22 may be used to adjust the output voltage of the power supply module 23 according to the transmit power detected by the parameter detection module 21. Different bias voltages are used to supply power to the radio frequency power amplifier when the transmit power of the radio frequency power amplifier is different. For example, when the transmit power detected by the parameter detection module 21 is 24 dB, the output voltage of the power supply module 23 may be 3.3 V; when the transmit power detected by the parameter detection module 21 is 20 dB, the output voltage of the power supply module 23 may be 3.0 V; when the transmit power detected by the parameter detection module 21 is 18 dB, the output voltage of the power supply module 23 may be 2.8 V. Because the detection is carried out at the output end of the radio frequency power amplifier, the result of the detection is comparatively precise, which facilitates precise control of the supply voltage of the radio frequency power amplifier, so that the radio frequency power amplifier works with a best efficiency point.

If the parameter detection module 21 is disposed at the input end of the radio frequency power amplifier, the parameter detection module 21 may detect the input power of the radio frequency power amplifier. The control module 22 may be used to adjust the output voltage of the power supply module 23 according to the input power detected by the parameter detection module 21. Different bias voltages are used to supply power to the radio frequency power amplifier when the input power of the radio frequency power amplifier is different. For example, when the input power detected by the parameter detection module 21 is −6 dB, the output voltage of the power supply module 23 may be 3.3 V; when the input power detected by the parameter detection module 21 is −10 dB, the output voltage of the power supply module 23 may be 3.0 V; when the input power detected by the parameter detection module 21 is −12 dB, the output voltage of the power supply module 23 may be 2.8 V. Because the detection is carried out at the input end of the radio frequency power amplifier, time effectiveness is good and the transmit power of the radio frequency power amplifier can be detected in advance, so that the control module 22 can adjust the output voltage of the power supply module 23 more quickly to get adapted to the change of the transmit power.

If the parameter detection module 21 is disposed at the input end of the radio frequency power amplifier, the parameter detection module 21 may detect the current of the radio frequency power amplifier. The control module 22 may be used to adjust the output voltage of the power supply module 23 according to the current detected by the parameter detection module 21. Different bias voltages are used to supply power to the radio frequency power amplifier when the input currents of the radio frequency power amplifier are different.

In the embodiment, the parameter detection module is used to detect a system parameter on the radio frequency transmit channel of the radio frequency power amplifier and the control module is used to adjust the output voltage of the power supply module according to the system parameter detected by the parameter detection module, so that the power loss of the radio frequency power amplifier is reduced and the efficiency of the radio frequency power amplifier is increased, thereby reducing the size and power consumption of a communication device to save the cost of use, prolong the service life of parts, and make a communication system less dependent on an environment.

Embodiment 6

Figure 5:
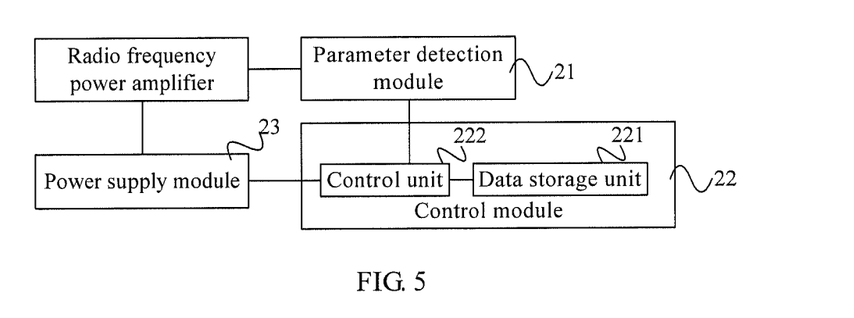
FIG. 5 is a schematic structural diagram of a power supply device for a radio frequency power amplifier according to a sixth embodiment of the present invention.

FIG. 5 is a schematic structural diagram of a power supply device for a radio frequency power amplifier provided in a sixth embodiment of the present invention. As shown in FIG. 5, compared with the previous embodiment, a control module 22 in the power supply device for the radio frequency power amplifier in the embodiment may include a data storage unit 221 and a control unit 222. The data storage unit 221 is configured to store corresponding information between a system parameter and a voltage parameter; the control unit 222 is connected to the data storage unit 221, a parameter detection module 21, and a power supply module 23, and configured to determine, according to the system parameter detected by the parameter detection module 21, a voltage parameter by using the corresponding information between the system parameter and the voltage parameter stored by the data storage unit 221.

In the embodiment, the parameter detection module is used to detect a system parameter on the radio frequency transmit channel of the radio frequency power amplifier and the control module is used to adjust the output voltage of the power supply module according to the corresponding information between the system parameter and the voltage parameter stored by the data storage unit, so that the power loss of the radio frequency power amplifier is reduced and the efficiency of the radio frequency power amplifier is increased, thereby reducing the size and power consumption of a communication device to save the cost of use, prolong the service life of parts, and make a communication system less dependent on an environment.

Embodiment 7

Figure 6:
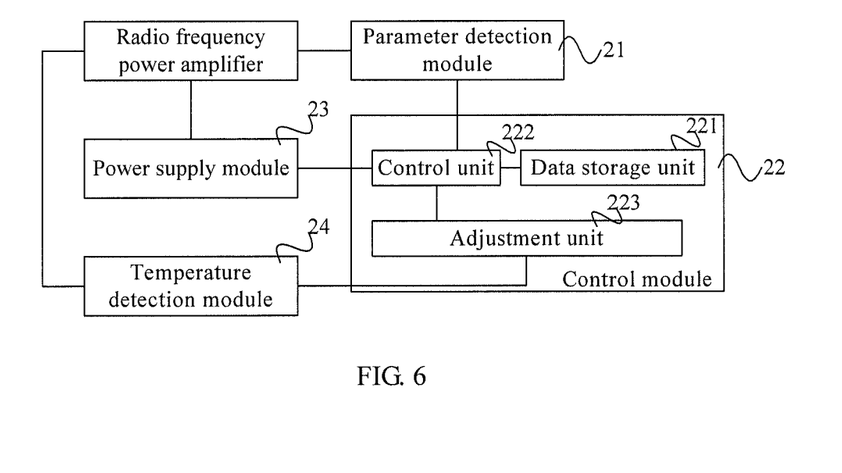
FIG. 6 is a schematic structural diagram of a power supply device for a radio frequency power amplifier according to a seventh embodiment of the present invention.

FIG. 6 is a schematic structural diagram of a power supply device for a radio frequency power amplifier provided in a seventh embodiment of the present invention. As shown in FIG. 6, compared with the previous embodiment, the power supply device for the radio frequency power amplifier in the embodiment may further include a temperature detection module 24 disposed in the radio frequency power amplifier, and configured to detect system temperature. A control module 22 in the power supply device for the radio frequency power amplifier in the embodiment may further include an adjustment unit 223 which is connected to the temperature detection module 24 and a control unit 222 and is configured to adjust, according to the system temperature detected by the temperature detection module 24, a voltage parameter determined by the control unit 222.

In the embodiment, the temperature detection module is used to detect the system temperature of the radio frequency power amplifier, and the adjustment unit is used to adjust the voltage parameter determined by the control unit. When the temperature rises to a certain degree, power can be reduced by adjusting a supply voltage, so as to prevent further rising of the temperature, thereby avoiding shutdown of a chip due to very high temperature and prolonging the service life of parts.

An embodiment of the present invention may further provide a communication device, which includes a radio frequency power amplifier and the power supply device for the radio frequency power amplifier provided in any one of the fifth, sixth, and seventh embodiments of the present invention.

The foregoing specific embodiments are not intended to limit the present invention. For persons of ordinary skill in the art, any modification, equivalent replacement, and improvement made without departing from the principle of the present invention shall fall within the protection scope of the present invention.

What is claimed is:

1. A voltage driving apparatus for a power amplifier, comprising a voltage input module and a voltage output module, wherein the voltage output module is connected to the power amplifier to supply voltage for the power amplifier, the voltage driving apparatus further comprising:
   a signal input module, configured to receive a variable input electric signal which is an input variable bias voltage or an input variable pulse signal for identifying the supply voltage for the power amplifier; and
   a control module, electrically connected to the signal input module, electrically connected to the voltage input module, and electrically connected to the voltage output module,
      the control module configured to:
         store a table of corresponding information between supply voltages for the power amplifier and variable input electric signals of input variable bias voltages or input variable pulse signals,
         detect the variable input electric signal of the input variable bias voltage, or the input variable pulse signal, which is received by the signal input module, and
         dynamically adjust the supply voltage of the voltage output module for the power amplifier by identifying a supply voltage corresponding to the detected variable input electric signal of the input variable bias voltage or the input variable pulse signal, according to the stored table.

2. The voltage driving apparatus according to claim 1, wherein the voltage driving apparatus is a DC/DC power converter.

3. The voltage driving apparatus according to claim 1, wherein:
the control module identifies the supply voltage according to a voltage value of the bias voltage in the stored table.

4. The voltage driving apparatus according to claim 1, wherein:
the control module identifies the supply voltage according to a duty cycle of the pulse signal in the stored table.

5. The voltage driving apparatus according to claim 1, wherein the signal input module is implemented as a parameter detection module, disposed on a radio frequency transmit channel of the power amplifier, and configured to detect the variable input electric signal as a system parameter on the radio frequency transmit channel;
the control module is configured to determine a voltage parameter according to the system parameter detected by the parameter detection module; and
the voltage output module implemented as a power supply module is configured to provide the output voltage corresponding to the voltage parameter determined by the control module to the radio frequency power amplifier.

6. A power amplifying system, comprising:
a power amplifier and
a voltage driving apparatus, wherein the voltage driving apparatus comprises a voltage input module and a voltage output module, wherein the voltage output module is connected to the power amplifier to supply voltage for the power amplifier to the power amplifier,
the voltage driving apparatus further comprising:
a signal input module, configured to receive a variable input electric signal which is an input variable bias voltage or an input variable pulse signal for identifying the output voltage for the power amplifier; and
a control module, electrically connected to the signal input module electrically connected to the voltage input module, and electrically connected to the voltage output module,
the control module configured to:
store a table of corresponding information between supply voltages for the power amplifier and variable input electric signals of input variable bias voltages or input variable pulse signals,
detect the variable input electric signal of the input variable bias voltage, or the input variable pulse signal, which is received by the signal input module, and
dynamically adjust the supply voltage of the voltage output module for the power amplifier by identifying the supply voltage corresponding to the detected variable input electric signal of the input variable bias voltage or the input variable pulse signal, according to the stored table.

7. The power amplifying system according to claim 6, wherein the voltage driving apparatus is a DC/DC power converter.

8. The power amplifying system according to claim 6, wherein:
the control module identifies the supply voltage according to a voltage value of the bias voltage in the stored table.

9. The power amplifying system according to claim 6, wherein:
the control module identifies the supply voltage according to a duty cycle of the pulse signal in the stored table.

10. A power supply device for a radio frequency power amplifier, wherein the power supply device is communicably connected to the radio frequency power amplifier, the power supply device comprising:
a parameter detection module, disposed on a radio frequency transmit channel of the radio frequency power amplifier, and configured to detect a system parameter on the radio frequency transmit channel according to a transmit power, an input power, or a current, of the radio frequency power amplifier;
a control module, connected to the parameter detection module, and configured to store a table of corresponding information between a voltage parameter and a system parameter and to determine a voltage parameter corresponding to the detected system parameter, according to a detection of a variable input electric signal of a bias voltage or a pulse signal for the detected system parameter from the parameter detection module and the stored table; and
a power supply module, connected to the control module, and configured to provide, to the radio frequency power amplifier, a voltage corresponding to the determined voltage parameter.

11. The power supply device for the radio frequency power amplifier according to claim 10, further comprising:
a temperature detection module, communicably connected to the radio frequency power amplifier, and configured to detect a system temperature of the radio frequency power amplifier; and
the control module further comprises:
an adjustment unit, connected to the temperature detection module and the control unit, the control module configured to adjust, according to the detected system temperature, the determined voltage parameter.

12. The power supply device for the radio frequency power amplifier according to claim 10, wherein the radio frequency transmit channel of the radio frequency power amplifier comprises an output end and an input end, and the parameter detection module is disposed at the output end of the radio frequency transmit channel of the radio frequency power amplifier and is further configured to detect the transmit power of the radio frequency power amplifier; and
the control module is further configured to determine the voltage parameter according to the detected transmit power.

13. The power supply device for the radio frequency power amplifier according to claim 12, wherein the parameter detection module is disposed at the input end of the radio frequency transmit channel of the radio frequency power amplifier and is further configured to detect the input power of the radio frequency power amplifier; and
the control module is further configured to determine the voltage parameter according to the detected input power.

14. The power supply device for the radio frequency power amplifier according to claim 12, wherein the parameter detection module is disposed at the input end of the radio frequency transmit channel of the radio frequency power amplifier and further configured to detect the current of the radio frequency power amplifier; and
the control module is further configured to determine the voltage parameter according to the detected current.

* * * * *